United States Patent
Patel et al.

(10) Patent No.: US 11,764,648 B2
(45) Date of Patent: Sep. 19, 2023

(54) ROTATING RECTIFIERS

(71) Applicant: Hamilton Sundstrand Corporation, Charlotte, NC (US)

(72) Inventors: Dhaval Patel, Schaumburg, IL (US); Craig J. Wojcik, Evansville, WI (US); Edward C. Allen, Davis, IL (US); Ted A. Martin, Winnebago, IL (US); Andrew R. Wilkinson, Cherry Valley, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 234 days.

(21) Appl. No.: 17/114,368

(22) Filed: Dec. 7, 2020

(65) Prior Publication Data

US 2022/0181949 A1 Jun. 9, 2022

(51) Int. Cl.
*H02K 11/042* (2016.01)
*H02M 7/00* (2006.01)
*H01L 25/11* (2006.01)
*H02M 7/06* (2006.01)

(52) U.S. Cl.
CPC .......... *H02K 11/042* (2013.01); *H01L 25/112* (2013.01); *H02M 7/003* (2013.01); *H02M 7/06* (2013.01)

(58) Field of Classification Search
CPC .............................. H02K 11/042; H02M 7/003
See application file for complete search history.

(56) References Cited

U.S. PATENT DOCUMENTS

| | | | |
|---|---|---|---|
| 4,603,344 A | * | 7/1986 | Trommer ............... H01L 25/112 361/744 |
| 5,138,210 A | | 8/1992 | Crickmore et al. |
| 5,796,196 A | * | 8/1998 | Johnsen ............... H01L 25/112 363/145 |
| 7,586,224 B2 | | 9/2009 | Osborn et al. |
| 9,369,029 B2 | | 6/2016 | Hasan et al. |
| 10,103,604 B2 | | 10/2018 | Chitsaz et al. |
| 2006/0284499 A1 | * | 12/2006 | Rubbo ................. H02K 11/042 310/71 |
| 2014/0226383 A1 | | 8/2014 | Brust et al. |
| 2014/0312722 A1 | * | 10/2014 | Raad ...................... H02K 9/227 310/67 R |
| 2016/0226348 A1 | * | 8/2016 | Rittmeyer ............ H02K 11/042 |

OTHER PUBLICATIONS

Extended European Search Report, of the European Patent Office, dated Apr. 26, 2022, in corresponding European Patent Application No. 21212549.6.

* cited by examiner

*Primary Examiner* — Jue Zhang
(74) *Attorney, Agent, or Firm* — Locke Lord LLP; Daniel J. Fiorello; Gabrielle L. Gelozin

(57) ABSTRACT

A diode pack housing for a rotating rectifier assembly can include a body having an interior surface defining an interior cavity open on a first end and configured to contain a diode pack and a plurality of bus bar channels defined axially on or in the inner surface in the interior cavity. The plurality of bus bar channels can be five or less bus bar channels.

13 Claims, 7 Drawing Sheets

ROTATING RECTIFIERS

FIELD

This disclosure relates to rotating rectifiers, e.g., for variable frequency generators (VFGs).

BACKGROUND

Traditional rotating rectifiers (e.g., for variable frequency generators) can include four connection points on the AC side and two connection points on the DC side. Only three of the four connections in existing designs are utilized on the AC side of the rotating rectifier. The fourth connection point is utilized to mechanically balance the rotating rectifier. In such cases, the bus bars are spaced 60° apart from each other and are 60° apart from the next live terminal. Another problem with existing systems is that the diode plate is only 0.099" away from a bus bar and requires a key feature to accommodate an installation tool. In certain applications, the dielectric clearance should be at least 0.125" for example.

Also, for existing designs the oil has to flow into the rectifier from the Front of the unit and through the rectifier out the end. This is because of the existing two piece housing, so the oil cannot be fed into the rectifier from the back of the unit.

Further, in traditional systems, because of the spacing of all of the connections, the DC connections cannot be accommodated on the front of the housing. As a result, this rectifier style cannot be re-applied to systems were all of the AC and DC are in the same area. For example, existing systems are suited for two-pole style rotors, which does not suit VFG applications where the DC leads are not 180° apart.

Additionally, the traditional systems utilize two pieces of the housings to hold the DC bus bars in place. This type of system was designed for 24,000 RPM, and, due to the split between the housing, the DC connections can come loose if operated at higher speeds.

Such conventional methods and systems have generally been considered satisfactory for their intended purpose. However, there is still a need in the art for rotating rectifiers. The present disclosure provides a solution for this need.

SUMMARY

A diode pack housing for a rotating rectifier assembly can include a body having an interior surface defining an interior cavity open on a first end and configured to contain a diode pack and a plurality of bus bar channels defined axially on or in the inner surface in the interior cavity. The plurality of bus bar channels can be five or less bus bar channels.

The five or less bus bar channels can be exactly five bus bar channels. In certain embodiments, the five bus bar channels can be disposed 72 degrees apart on or in the interior surface to evenly space the bus bar channels.

The diode pack housing can include an end face extending radially inwardly at a second end having five axially extending terminal orifices extending through the end face each terminal orifice positioned corresponding to a respective bus bar channel. The diode pack housing can include a bushing stop hole for a bushing stop defined centrally through the end face, for example.

In certain embodiments, the body (e.g., the entire diode pack housing) can be a single piece. The diode pack housing can also include one or more radial holes defined through the end face from the bushing stop hole to an outer diameter of the body. In certain embodiments, one or more angled holes (e.g., bleed holes) can fluidly connecting the interior cavity and a respective radial hole.

In accordance with at least one aspect of this disclosure, a rotating rectifier assembly can include a diode pack housing as disclosed herein, e.g., as described above, and a bus bar disposed in each bus bar channel and extending axially along each bus bar channel to a respective terminal. Three bus bars can be AC inputs for allowing input of a 3-phase AC signal and two bus bars can be a positive and a negative DC output to allow output of a DC signal.

The assembly can further include a diode pack disposed and retained within the interior cavity and in electrical communication with the bus bars to rectify the 3-phase AC signal to a DC signal. The diode pack can include one or more diode plates configured to electrically connect a diode to one or more of the bus bars.

The one or more diode plates can include a terminal tang extending radially from a central body of each diode plate to insert into a respective bus bar channel and/or to electrically connect to a bus bar. The one or more diode plates can include a plurality of positioning tangs extending radially from the central body and configured to contact the interior surface.

The plurality of positioning tangs can be three positioning tangs, for example. The terminal tang can be positioned relative to the three positioning tangs such that when the terminal tang is disposed in a bus bar channel, the positioning tangs are not able to contact another bus bar.

In certain embodiments, the terminal tang can be positioned 180 degrees from a middle of the three positioning tangs. In certain embodiments, the three positioning tangs can be disposed 72 degrees apart from each other.

The assembly can include a plurality of diodes. The one or more diode plates can include a plurality of diode plates, and each diode can be sandwiched between two diode plates. In certain embodiments, the plurality of diodes share diode plates between adjacent diodes.

In certain embodiments, the assembly can include a metallic outer case. The diode pack housing can be retained within the metallic outer case, for example. In certain embodiments, the metallic outer case can be aluminum. The diode pack housing can be retained within the outer case between a case end face and a clip disposed within the case.

The assembly can further include a bushing stop disposed within a bushing stop hole of the diode pack housing, and a seat assembly disposed in the an opposing end of the interior cavity of the housing such that the diode pack is sandwiched between the seat assembly and the bushing stop such that the seat assembly presses the diode pack against the bushing stop.

The seat assembly can include a seat, a pivot disposed pivotable on the seat, a retainer retaining the pivot to the seat and the seat to the diode pack, and a transfer tube disposed within an interior channel of the pivot to supply fluid to interior cavity of the diode pack housing through the pivot and the seat. In certain embodiments, the transfer tube includes a flange extending therefrom sandwiched between the outer case and the first end of the diode pack housing, wherein the diode pack housing is sealed to the outer case via one or more seals disposed on an outer diameter thereof.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1:
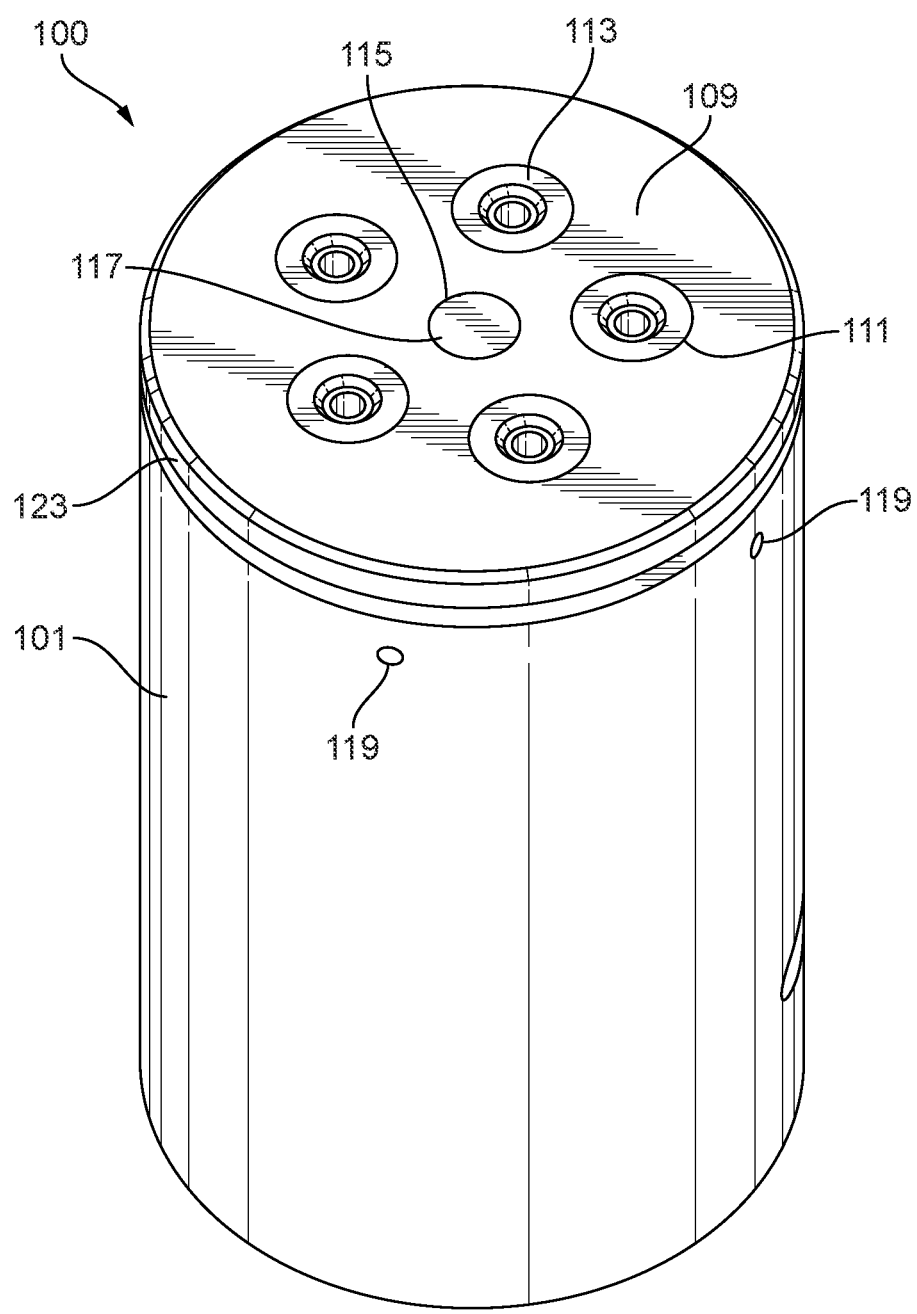
FIG. 1 is a perspective view of an embodiment of a diode pack housing in accordance with this disclosure, shown having terminals and a bushing stop disposed therein.

Reference will now be made to the drawings wherein like reference numerals identify similar structural features or aspects of the subject disclosure. For purposes of explanation and illustration, and not limitation, an illustrative view of an embodiment of a housing in accordance with the disclosure is shown in FIG. 1 and is designated generally by reference character 100. Other embodiments and/or aspects of this disclosure are shown in FIGS. 2-7.

Figure 2:
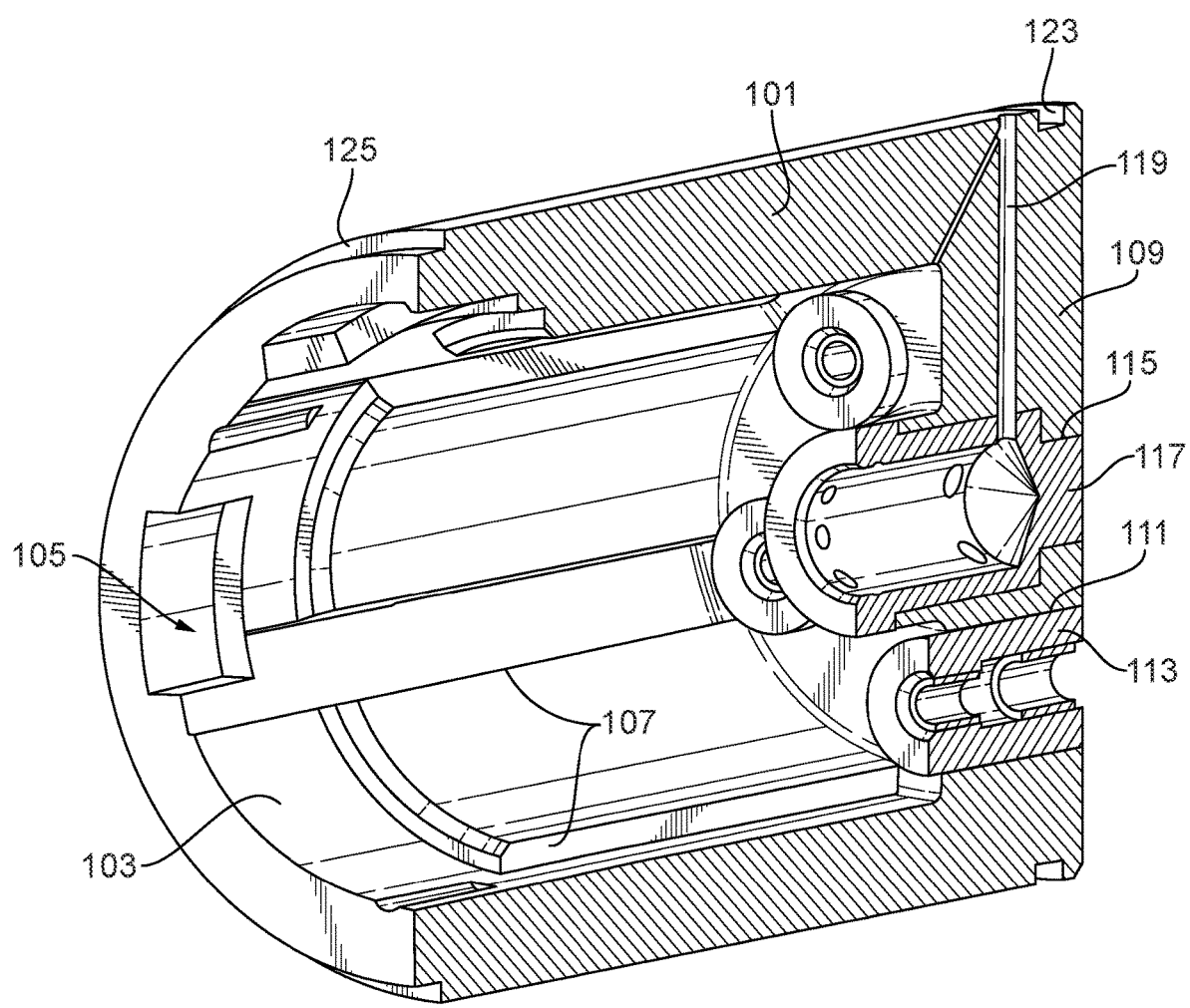
FIG. 2 is a cross-sectional perspective view of the embodiment of FIG. 1.
Figure 3:
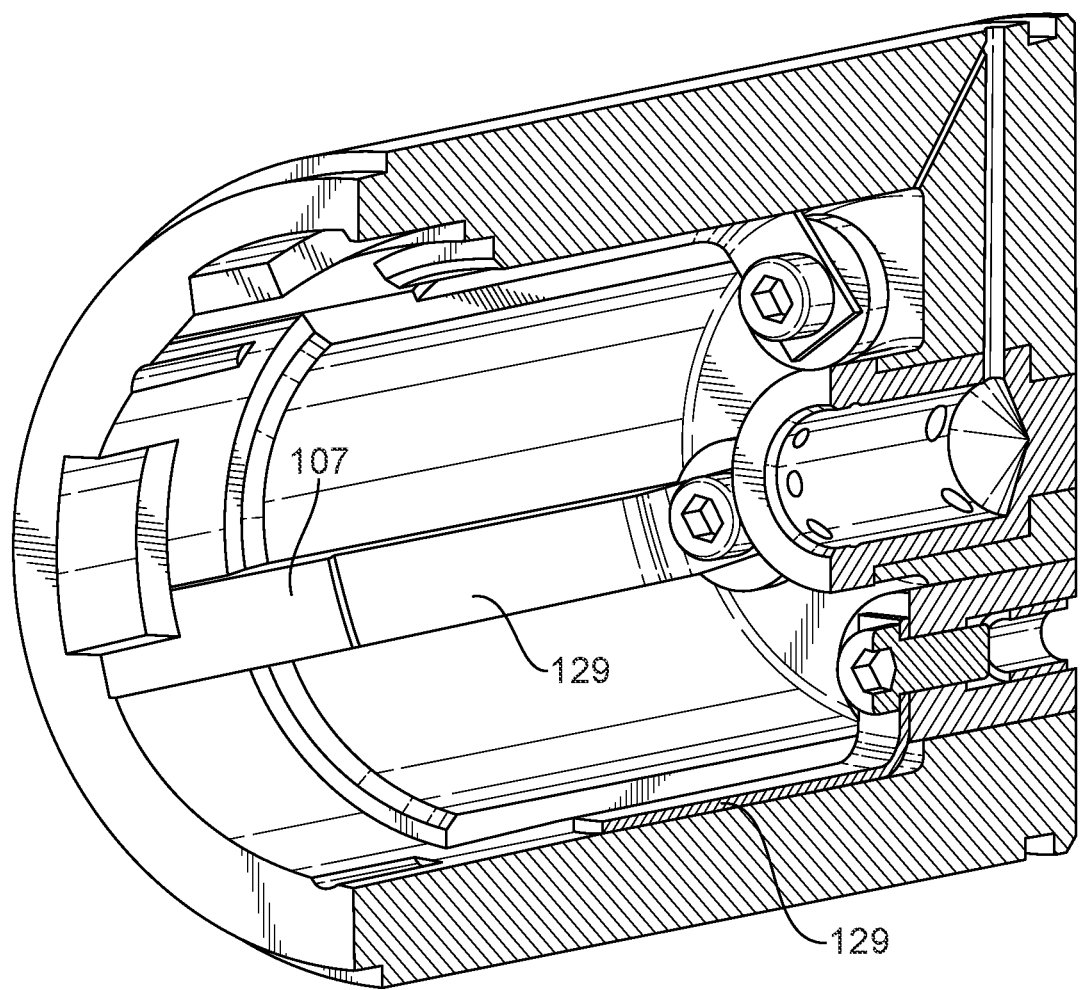
FIG. 3 is a cross-sectional perspective view of the embodiment of FIG. 2, shown having bus bars disposed therein and electrically connected to the terminals.
Figure 6:
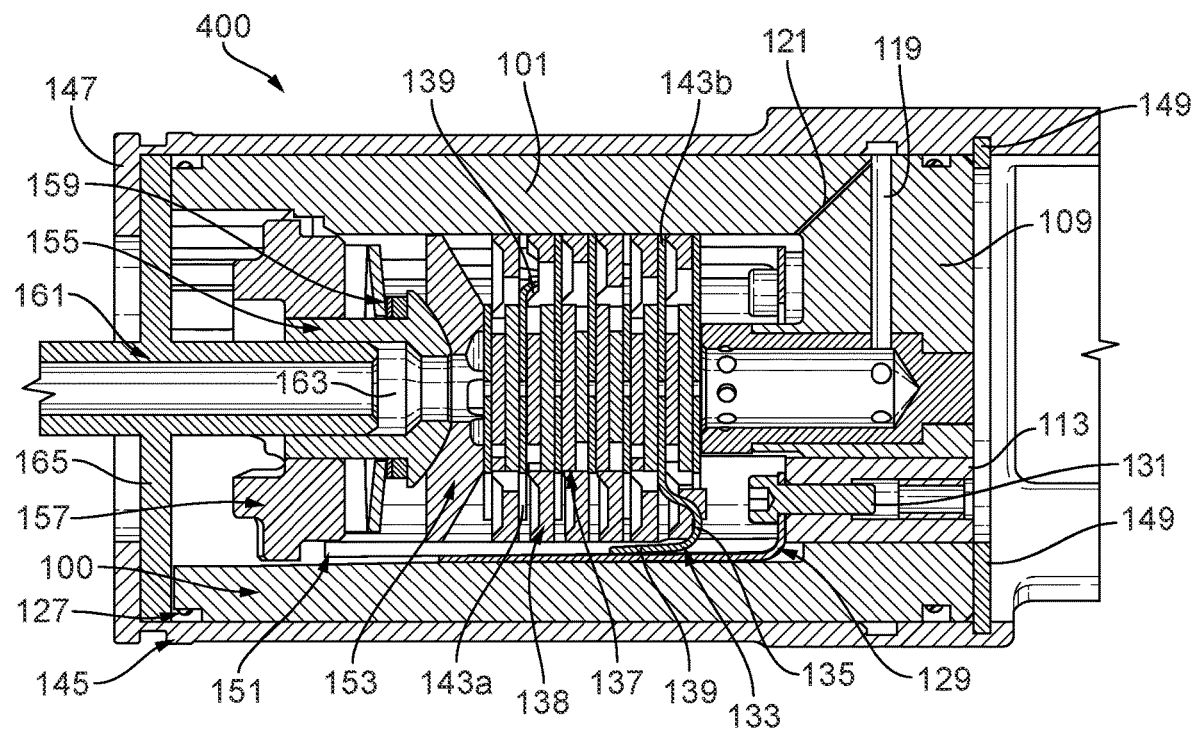
FIG. 6 is a side cross-sectional view of the assembly of FIG. 4.

Referring to FIGS. 1 and 2, a diode pack housing 100 for a rotating rectifier assembly (e.g., as shown in FIGS. 4-7 can include a body 101 having an interior surface 103 defining an interior cavity 105 open on a first end and configured to contain a diode pack (e.g., as shown in FIG. 6). The diode pack housing 100 can include a plurality of bus bar channels 107 defined axially on or in the inner surface in the interior cavity 105. The plurality of bus bar channels 107 can be five or less bus bar channels 107, for example. As shown, the bus bar channels 107 can be axially directed rectangular slots, however, any other suitable shape is contemplated herein.

In certain embodiments, the five or less bus bar channels 107 can be exactly five bus bar channels 107, e.g., as shown. In certain embodiments, the five bus bar channels 107 can be disposed 72 degrees apart on or in the interior surface 103 to evenly space the bus bar channels 107.

The diode pack housing 100 can include an end face 109 extending radially inwardly at a second end. The end face 109 can have five axially extending terminal orifices 111 extending through the end face 109 (e.g., shown having terminals 113 disposed therein in FIG. 1-3). The end face 109 can at least partially enclose the interior cavity 105 at the second end opposite of the open first end of the body 101. Each terminal orifice 111 can be positioned corresponding to a respective bus bar channel 107, for example (e.g., 72 degrees spaced). As shown, each bus bar channel 107 can extend to and be bordered by the end face 109 adjacent a respective terminal 113. The terminals 113 can be any suitable conductive structure (e.g., a conductive threaded member configured to receive a screw to fix a bus bar to the terminal 113).

In certain embodiments, the diode pack housing 100 can include a bushing stop hole 115 for a bushing stop 117 defined centrally through the end face 109, for example. An embodiment of a bushing stop 117 is shown disposed in the bushing stop hole 115 in FIGS. 1-3 and FIGS. 4-7. The bushing stop hole 115 can include a reducing diameter shape (e.g., stepped wedding cake shape as shown). Any suitable shape is contemplated herein.

In certain embodiments, the body 101 (e.g., the entire diode pack housing) can be a single piece (e.g., manufacture via additive manufacturing or molding). The diode pack housing 100 can also include one or more radial holes 119 defined through the end face 109 from the bushing stop hole 115 (e.g., an inner diameter of the end face 109) to an outer diameter of the body 101. In certain embodiments, one or more angled holes (e.g., bleed holes) 121 can fluidly connecting the interior cavity 105 and a respective radial hole 119. The housing 100 can also include one or more annular slots 123, 125 configured to receive and at least partially retain a seal (e.g., an o-ring 127 as shown in FIG. 6).

Referring additionally to FIGS. 4-7, in accordance with at least one aspect of this disclosure, a rotating rectifier assembly 400 can include a diode pack housing 100 as disclosed herein, e.g., as described above. The assembly 400 can also include a bus bar 129 disposed in each bus bar channel 107 and extending axially along each bus bar channel 107 to a respective terminal 113.

Figure 4:
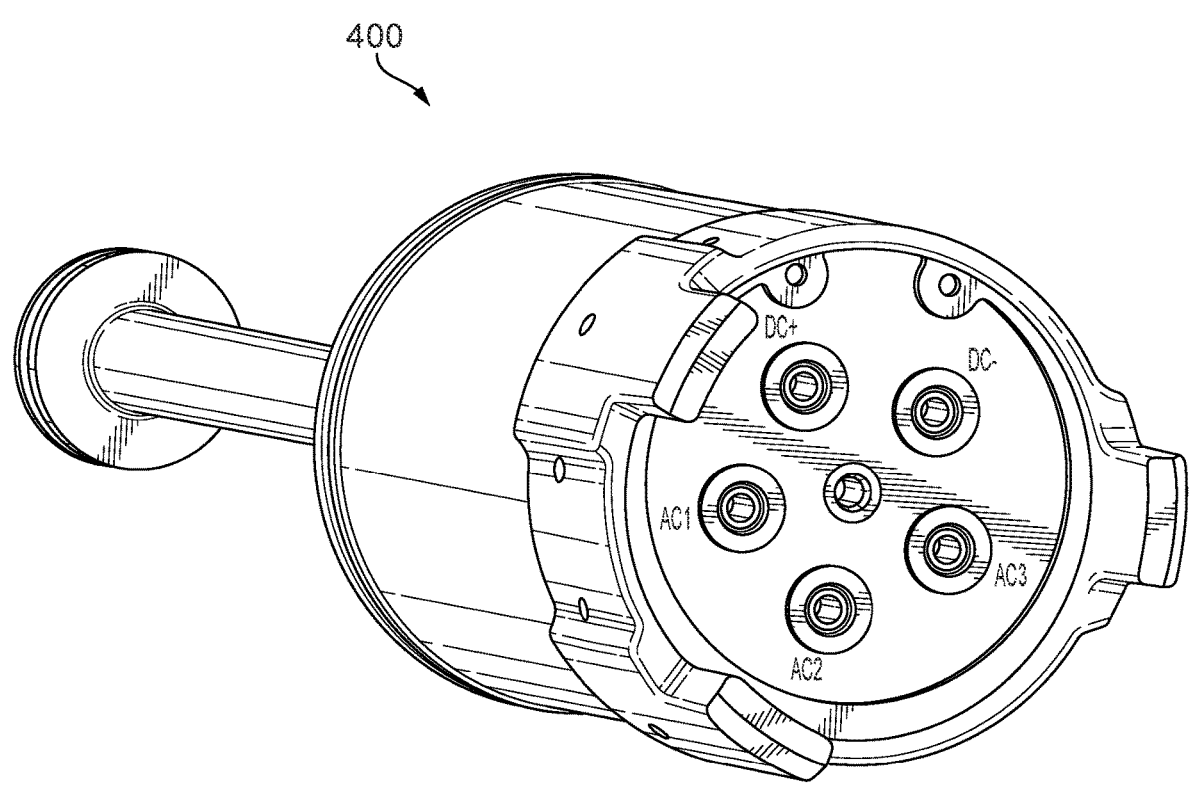
FIG. 4 is a perspective view of an embodiment of an assembly in accordance with this disclosure.
Figure 5:
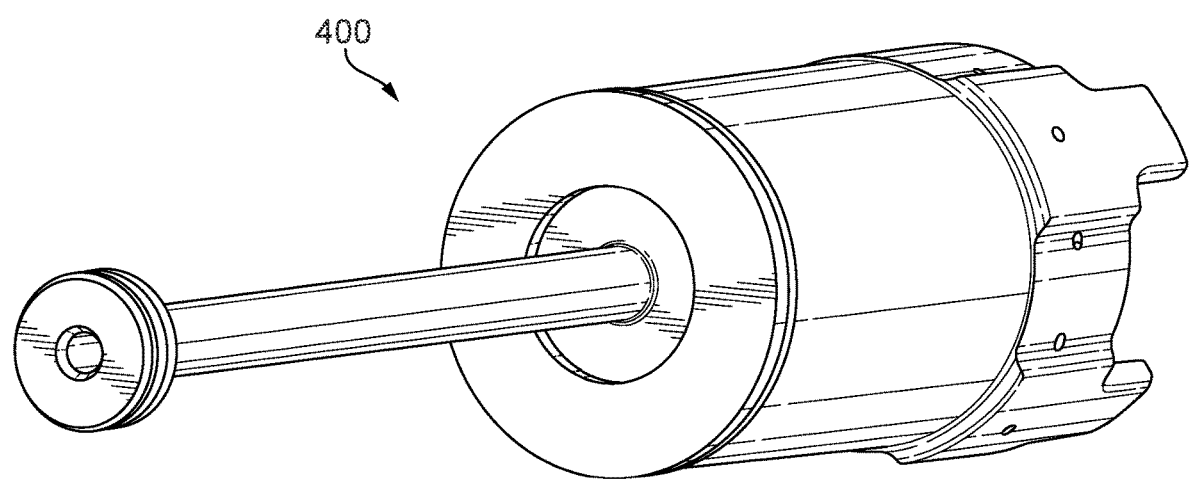
FIG. 5 is a rear perspective view of the assembly of FIG. 4.
Figure 7:
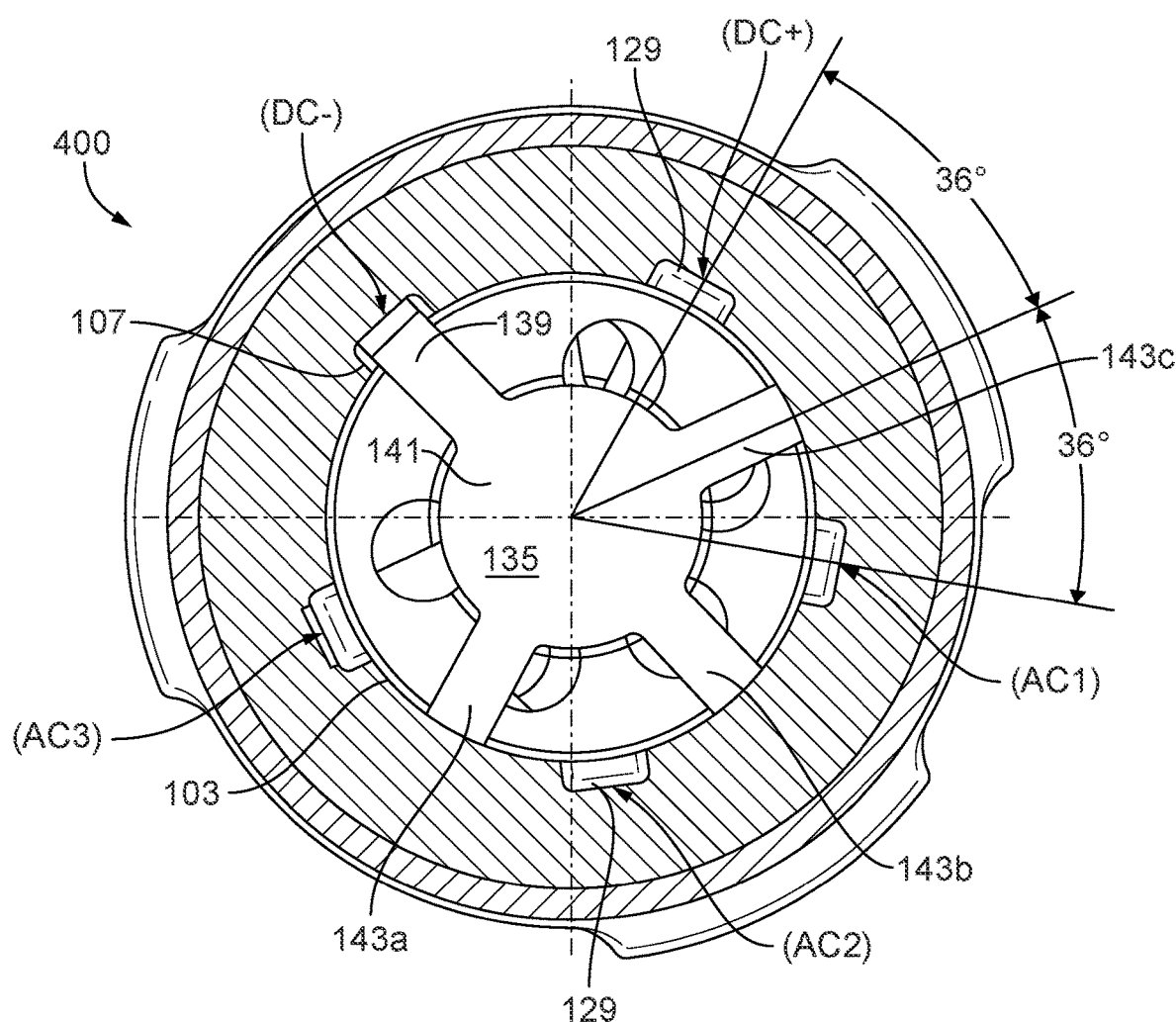
FIG. 7 is a plan cross-sectional view of the assembly of FIG. 4.

As shown (e.g., in FIG. 3), each bus bar 129 can be electrically connected (e.g., bolted via bolts 131) a respective terminal 113. Three bus bars 129 can be AC inputs (e.g., AC1, AC2, AC3 as shown in FIG. 7) for allowing input of a 3-phase AC signal and two bus bars 129 can be a positive and a negative DC output (e.g., DC+, DC− as shown in FIGS. 4 and 7) to allow output of a DC signal.

The assembly 400 can further include a diode pack 133 disposed and retained within the interior cavity 105 and in electrical communication with the bus bars 129 to rectify the 3-phase AC signal to a DC signal. The diode pack 133 can include one or more diode plates 135 configured to electrically connect a diode 137 to one or more of the bus bars 129. One or more diodes 137 can be held within a diode locator 138 (e.g., a disk surrounding each diode 137) as appreciated by those having ordinary skill in the art in view of this disclosure.

The one or more diode plates 135 can include a terminal tang 139 extending radially from a central body 141 of each diode plate 135 to insert into a respective bus bar channel 107 and/or to electrically connect to a bus bar 129. The terminal tang 139 can include any suitable shape (e.g., radially extending from the central body 141 and having at least a portion that extends axially, e.g., at a bend as shown).

The one or more diode plates 135 can include a plurality of positioning tangs 143a, b, c extending radially from the central body 141 and configured to contact the interior surface 103. The plurality of positioning tangs can be three positioning tangs 143a, b, c, for example. The terminal tang 139 can be positioned relative to the three positioning tangs 143a, b, c such that when the terminal tang 139 is disposed in a bus bar channel 107 (e.g., as shown), the positioning tangs 143a, b, c are not able to contact another bus bar 129.

In certain embodiments, the terminal tang 133 can be positioned 180 degrees from a middle tang 143b of the three positioning tangs 143a, b, c. In certain embodiments, the three positioning tangs 143a, b, c can be disposed 72 degrees apart from each other.

As shown, the assembly 400 can include a plurality of diodes 137. For example, the plurality of diodes 137 can include six diodes 137 as shown. Any suitable number of diodes 37 is contemplated herein.

The one or more diode plates 135 can include a plurality of diode plates 135. For example, each diode 137 can be sandwiched between two diode plates 135 as shown. In certain embodiments, the plurality of diodes 137 share diode plates 137 between adjacent diodes 137. The diodes 137 can have their polarities arranged, e.g., as shown, to form a full rectifying bridge.

In certain embodiments, the assembly 400 can include a metallic outer case 145. The diode pack housing 100 can be retained within the metallic outer case 145, for example. In certain embodiments, the metallic outer case 145 can be aluminum. The outer case 145 can include outer holes, e.g., as shown, configured to be in fluid communication with the holes 119.

The diode pack housing 100 can be retained within the outer case 145 between a case end face 147 and a clip 149 (e.g., and E-clip) disposed within the case 145. Any suitable clip type is contemplated herein.

The assembly 400 can further include a bushing stop 117 disposed within the bushing stop hole 115 of the diode pack housing 100. The bushing stop 117 can include a plurality of openings configured to be located within the end face 109, each opening corresponding to a respective hole 119, e.g., as shown. The bushing stop 117 can also include a plurality of interior openings configured to be open to the interior cavity 105, e.g., as shown. The interior opening and the other openings of the bushing stop 117 can be in fluid communication through a bushing stop channel defined therein.

The assembly 400 can include a seat assembly 151 disposed in the an opposing end of the interior cavity 105 of the housing 100 such that the diode pack 133 is sandwiched between the seat assembly 151 and the bushing stop 117 such that the seat assembly 151 presses the diode pack 133 against the bushing stop 117. In certain embodiments, the seat assembly 151 can include a seat 153, a pivot 155 disposed pivotable on the seat 153, a retainer 157 (e.g., a twist retainer) retaining the pivot 155 to the seat 153 and the seat 153 to the diode pack 133. A shim and Bellville washer 159 can be disposed between the twist retainer 157 and the pivot 155.

The assembly 400 can include a transfer tube 161 disposed within an interior channel 163 of the pivot 155 to supply fluid (e.g., oil) to interior cavity 105 of the diode pack housing 100 through the pivot 155 and the seat 153, for example. In certain embodiments, the transfer tube can include a flange 165 extending therefrom sandwiched between the outer case 145 and the first end of the diode pack housing 100. The diode pack housing 100 can be sealed to the outer case 145 via one or more seals 145 disposed on an outer diameter of the diode pack housing 100, e.g., as shown.

Embodiments can reduce the number of bus bars required, reducing weight and complexity. For example, no extra bus bar for a suppression resistor may be necessary for a variable frequency generator application. Reducing number of bus bars allows for a different shape diode plate, e.g., including a reduction in tangs. A reduction of tangs increases dielectric clearance of the diode plates as the effective average distance of the plate to the interior surface is increased (because less mass of tangs extends from the base portion). Certain embodiments also do not need a key feature on each diode plate and can use a hook tool for insertion and removal.

Embodiments use diode plates to make connections from the diodes to the bus bars. The bus bars can be located on the inner diameter of the diode pack housing. The stack of diodes and diode plates can be aligned axially and compressed against a bushing stop using a pivot, spring and twist retainer, for example. Embodiments provide unique bus bar spacing and diode plate design. An additional bus bar can be eliminated and the bus bars can be spaced 72° apart from each other. Additionally, the diode plate design can eliminate a key feature and simplified to accommodate the new reduced bus bar arrangement. The dielectric spacing of each diode plate can be greater than traditional designs and eliminate clearance issues.

The diode pack housing can be a single housing. This can eliminate the need for a seal, simplifying the hydraulic system. This can also increase the dielectric capability of the rotating rectifier by eliminating a seam. Embodiments can allow for coolant to be fed in from either side of the rotating rectifier assembly. The embodiment shown assumes cooling is being injected from the non-connection side of the rectifier assembly. If the cooling is to be injected from the connection side of the rectifier, the bushing stop can be modified to accommodate (e.g., to be similar to the transfer tube.

Embodiments can accommodate all of the electrical connections on one end, e.g., due to less terminals being needed. If it is necessary or desired to split the connections, the DC bus bars can be extended and connected using spring clips. Embodiments can include an aluminum housing. This housing can serve as an EMI filter for common mode noise that can be generated for systems which have engine start capability, output rectifiers, or output converters, for example.

Embodiments can be used as a high speed variable frequency generator rotating rectifier. Embodiments can provide improved dielectric clearance, versatility on the location of external connection points, a part count reduction, a manufacturing and assembly improvement, a simplified cooling scheme that does not have a leak path, a higher speed capability, and common mode noise filtering for VFGs that have an output converter or require engine start. Any other suitable use, features, and/or advantages thereof are contemplated herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A diode pack housing for a rotating rectifier assembly, comprising:
    a body having an interior surface defining an interior cavity open on a first end and configured to contain a diode pack; and
    a plurality of bus bar channels defined axially on or in the inner surface in the interior cavity, wherein the plurality of bus bar channels includes five or less bus bar channels, wherein the five or less bus bar channels are exactly five bus bar channels, wherein the five bus bar channels are disposed 72 degrees apart on or in the interior surface to evenly space the bus bar channels.

2. The diode pack housing of claim 1, further comprising an end face extending radially inwardly at a second end having five axially extending terminal orifices extending through the end face each terminal orifice positioned corresponding to a respective bus bar channel.

3. The diode pack housing of claim 2, further comprising a bushing stop hole for a bushing stop defined centrally through the end face.

4. The diode pack housing of claim 3, wherein the body is a single piece, further comprising one or more radial holes defined through the end face from the bushing stop hole to an outer diameter of the body, and one or more angled holes fluidly connecting the interior cavity and a respective radial hole.

5. A rotating rectifier assembly, comprising:
    a diode pack housing, comprising:
        a body having an interior surface defining an interior cavity open on a first end and configured to contain a diode pack; and
        a plurality of bus bar channels defined axially on or in the inner surface in the interior cavity, wherein the plurality of bus bar channels includes five or less bus bar channels;
    a bus bar disposed in each bus bar channel and extending axially along each bus bar channel to a respective terminal, wherein three bus bars are AC inputs for allowing input of a 3-phase AC signal and two bus bars are a positive and a negative DC output to allow output of a DC signal;
    a diode pack disposed and retained within the interior cavity and in electrical communication with the bus bars to rectify the 3-phase AC signal to a DC signal, wherein the diode pack includes one or more diode plates configured to electrically connect a diode to one or more of the bus bars, wherein the one or more diode plates include a terminal tang extending radially from a central body of each diode plate to insert into a respective bus bar channel and/or to electrically connect to a bus bar, wherein the one or more diode plates includes a plurality of positioning tangs extending radially from the central body and configured to contact the interior surface, wherein the plurality of positioning tangs are three positioning tangs, wherein the terminal tang is positioned relative to the three positioning tangs such that when the terminal tang is disposed in a bus bar channel, the positioning tangs are not able to contact another bus bar, wherein the terminal tang is positioned 180 degrees from a middle of the three positioning tangs, wherein the three positioning tangs are disposed 72 degrees apart from each other.

6. The assembly of claim 5, further comprising a plurality of diodes, wherein the one or more diode plates include a plurality of diode plates, wherein each diode is sandwiched between two diode plates.

7. The assembly of claim 6, wherein the plurality of diodes share diode plates between adjacent diodes.

8. The assembly of claim 5, further comprising a metallic outer case, wherein the diode pack housing is retained within the metallic outer case.

9. The assembly of claim 8, wherein the metallic outer case is aluminum.

10. The assembly of claim 8, wherein the diode pack housing is retained within the outer case between a case end face and a clip disposed within the case.

11. The assembly of claim 10, further comprising a bushing stop disposed within a bushing stop hole of the diode pack housing, and a seat assembly disposed in an opposing end of the interior cavity of the housing such that the diode pack is sandwiched between the seat assembly and the bushing stop such that the seat assembly presses the diode pack against the bushing stop.

12. The assembly of claim 11, wherein the seat assembly includes a seat, a pivot disposed pivotable on the seat, a retainer retaining the pivot to the seat and the seat to the diode pack, and a transfer tube disposed within an interior channel of the pivot to supply fluid to interior cavity of the diode pack housing through the pivot and the seat.

13. The assembly of claim 12, wherein the transfer tube includes a flange extending therefrom sandwiched between the outer case and the first end of the diode pack housing, wherein the diode pack housing is sealed to the outer case via one or more seals disposed on an outer diameter thereof.

\* \* \* \* \*